United States Patent
Kozasa et al.

(10) Patent No.: US 9,305,850 B2
(45) Date of Patent: Apr. 5, 2016

(54) ETCHING METHOD AND ETCHING APPARATUS OF SEMICONDUCTOR WAFER

(75) Inventors: Kazuaki Kozasa, Nagasaki (JP); Tomonori Kawasaki, Nagasaki (JP)

(73) Assignee: SUMCO TECHXIV CORPORATION, Omura-Shi, Nagasaki (JP)

(*) Notice: Subject to any disclaimer, the term of this patent is extended or adjusted under 35 U.S.C. 154(b) by 763 days.

(21) Appl. No.: 13/586,721

(22) Filed: Aug. 15, 2012

(65) Prior Publication Data
US 2012/0305187 A1 Dec. 6, 2012

Related U.S. Application Data

(62) Division of application No. 12/465,173, filed on May 13, 2009, now Pat. No. 8,273,260.

(30) Foreign Application Priority Data

May 15, 2008 (JP) ................................. 2008-128944

(51) Int. Cl.
| H01L 21/306 | (2006.01) |
| H01L 21/76 | (2006.01) |
| H01L 21/66 | (2006.01) |
| H01L 21/311 | (2006.01) |
| H01L 21/762 | (2006.01) |

(52) U.S. Cl.
CPC .......... *H01L 22/12* (2013.01); *H01L 21/31116* (2013.01); *H01L 21/76243* (2013.01); *H01L 21/76256* (2013.01); *H01L 22/26* (2013.01)

(58) Field of Classification Search
CPC ... H01L 22/12; H01L 21/76243; H01L 22/26; H01L 21/31116; H01L 21/76256

USPC ........................................ 156/345.25, 345.26
See application file for complete search history.

(56) References Cited

U.S. PATENT DOCUMENTS

| 5,423,944 A | 6/1995 | Wong |
| 6,248,603 B1 * | 6/2001 | Jones et al. ...................... 438/14 |
| 6,721,046 B1 * | 4/2004 | Halliyal et al. ............ 356/237.5 |
| 6,849,470 B1 | 2/2005 | Eriguchi et al. |

(Continued)

FOREIGN PATENT DOCUMENTS

| JP | 05-326480 | 12/1993 |
| JP | 06-168922 | 6/1994 |

(Continued)

OTHER PUBLICATIONS

Japan Patent Office, Notification of Reasons for Rejection for Japanese Application No. 2008-128944, mailed Mar. 5, 2013, 4 pages, Japan.

*Primary Examiner* — Jeffrie R Lund
(74) *Attorney, Agent, or Firm* — Alston & Bird LLP

(57) ABSTRACT

A method and an apparatus of etching a semiconductor wafer are provided. The etching apparatus of a semiconductor wafer having a marker inside includes: a monitoring device capable of monitoring a surface of the semiconductor wafer so as to detect the marker; a nozzle capable of jetting a mixed gas that contains hydrogen fluoride and ozone onto the surface of the semiconductor wafer; a regulator capable of adjusting at least one of hydrogen fluoride concentration and ozone concentration in the mixed gas; and a controller capable of determining whether the marker is detected by the monitoring device and terminating the etching process.

7 Claims, 7 Drawing Sheets

(56) References Cited

U.S. PATENT DOCUMENTS

| | | |
|---|---|---|
| 8,273,260 B2 * | 9/2012 | Kozasa et al. .................. 216/59 |
| 2003/0178390 A1 | 9/2003 | Odor et al. |
| 2004/0020513 A1 | 2/2004 | Bergman |
| 2004/0259328 A1 | 12/2004 | Ito et al. |
| 2005/0215063 A1 * | 9/2005 | Bergman .................... 438/710 |
| 2007/0161199 A1 | 7/2007 | Morita |
| 2009/0286333 A1 * | 11/2009 | Kozasa et al. .................... 438/9 |
| 2012/0305187 A1 * | 12/2012 | Kozasa et al. ............ 156/345.24 |

FOREIGN PATENT DOCUMENTS

| | | |
|---|---|---|
| JP | 09-190999 | 7/1997 |
| JP | 11-145419 | 5/1999 |
| JP | 2007-051051 | 3/2007 |

* cited by examiner

ETCHING METHOD AND ETCHING APPARATUS OF SEMICONDUCTOR WAFER

CROSS REFERENCE TO RELATED APPLICATIONS

The present application is a divisional application of and claims the benefit of priority from U.S. patent application Ser. No. 12/465,173, filed on May 13, 2009, which claims the benefit of priority from Japanese Patent Application No. 2008-128944 filed on May 15, 2008, both of which are hereby incorporated herein in their entirety by reference.

FIELD OF THE INVENTION

The present invention relates to an etching method and an etching apparatus of a semiconductor wafer. More specifically, the present invention relates to an etching method and an etching apparatus using a mixed gas that contains hydrogen fluoride and ozone.

BACKGROUND ART

In etching of the semiconductor wafer such as silicon wafer, both wet and dry processes may apply. In the wet type, a method of immersing the wafer in a mixed acid of $HF/HNO_3$ or in an alkali solution of NaOH, KOH, or the like is generally utilized. A method of processing the wafer with the mixed acid is also partially used in a single-wafer spinning manner. Further, in the dry type, an etching method of irradiating the wafer with excited ions or radicals generated by plasma is generally used. Various kinds of gases such as $CF_4$, etc. are used in such method. Also, although it is disclosed that the silicon wafer may be etched by a mixture gas of hydrogen fluoride gas and water vapor, which is further mixed with ozone (JP-A-06-168922), this method may be referred to as a wet method in reality because the wafer surface gets wet.

It is necessary to polish or etch a silicon wafer covered with an oxide film in manufacturing an SOI wafer and it is, in particular, desired to polish or etch the wafer with high precision (WO2005/074033).

However, it is difficult to monitor how deep the wafer is etched during the actual etching in a so-called wet state using a hydrogen fluoride solution to which an oxidant such as nitric acid or hydrogen peroxide is added. It is likewise difficult to monitor the surface being polished by a chemical polishing method or the like, thereby being practically unable to realize feedback in the middle of polishing. Here, even if it is etching with a mixture gas of hydrogen fluoride gas and water vapor, which is further mixed with ozone, the silicon wafer surface would get wet such that the etching is substantially conducted in a wet condition and, thus, it is also difficult to monitor the surface. For example, using an optical or infrared sensor or the like, it is still difficult to monitor the film thickness in the real time. Therefore, it is not easy to secure in-plane uniformity of the wafer surface. On the other hand, in the dry type, although it is rather easy to measure the film thickness, it is likely that additional apparatuses such as a vacuum chamber, a plasma generator, etc. are required in consideration of the facility configuration, thereby making the facility larger in scale.

Meanwhile, a polishing or etching amount is strongly demanded to be controlled with high precision in recent years so that it is desirable to perform feedback during polishing or etching. In etching or polishing the wafer constituted of layers made of different kinds of materials, in particular, it is difficult to secure a predetermined polishing or etching amount since polishing or etching rates may vary in respective layers. Further, in the chemical polishing utilizing variable polishing or etching rates according to different materials, overpolishing or overetching tends to occur when the rate variation exceeds the range having been estimated. Even otherwise, it is also likely to cause overpolishing or overetching since the initial setting tends to be made to avoid the insufficient polishing or etching amount.

SUMMARY OF THE INVENTION

In view of the above issue, one embodiment of the present invention provides an etching method of a semiconductor wafer in which a mixed gas that contains hydrogen fluoride and ozone is jetted onto a semiconductor wafer surface, the semiconductor wafer surface is monitored, and either or both of the hydrogen fluoride concentration and the ozone concentration are regulated based on the monitoring result. Another embodiment of the present invention provides an etching apparatus of a semiconductor wafer, comprising: a monitoring device capable of monitoring a surface of the semiconductor wafer; a nozzle capable of jetting the mixed gas that contains hydrogen fluoride and ozone; and a regulator capable of regulating either or both of the hydrogen fluoride concentration and the ozone concentration.

Further features of the present invention, its nature, and various advantages will be more apparent from the accompanying drawings and the following description of the preferred embodiment.

DETAILED DESCRIPTION OF THE PREFERRED EMBODIMENT

Now, embodiments of the present invention are described below with reference to the attached drawings and the following description is provided for describing the embodiments of the present invention and the present invention is not limited to the embodiments. The same or related symbols refer to the same or the same type of elements and redundant description may be omitted.

Figure 1A:
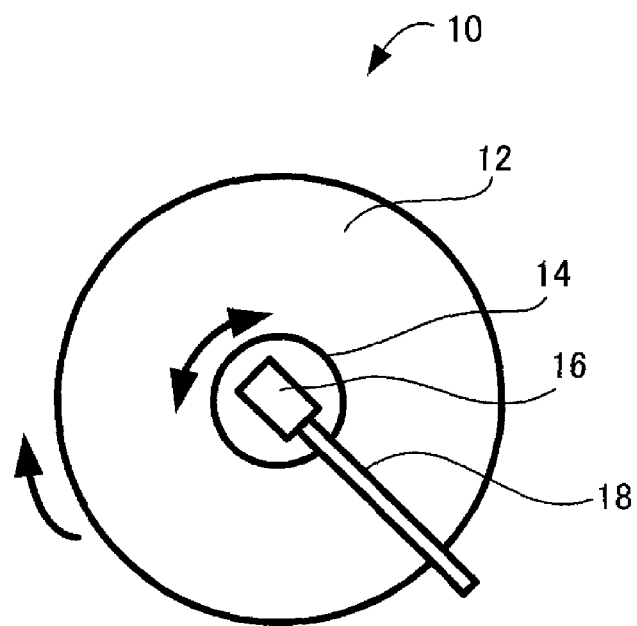
FIG. 1A is a schematic plan view showing a general configuration of an etching apparatus according to an embodiment of the present invention.
Figure 1B:
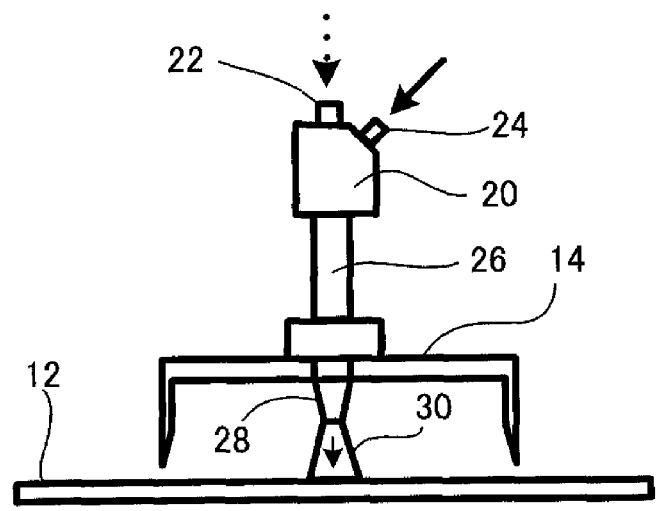
FIG. 1B is a schematic sectional view showing the etching apparatus of FIG. 1A.

FIG. 1A is a plan view showing a general configuration of an etching apparatus 10 according to an embodiment of the present invention and FIG. 1B is a sectional view thereof. A silicon wafer 12 is set in the apparatus 10 rotatably in a clockwise manner as indicated by the arrow and a cone 14 is suspended thereabove from a mixer 16 in which a mixed gas for etching is prepared. The mixer 16 is fixed to a swinging arm 18 that swings as indicated by the arrows. This configuration is now described in more detail in reference to the schematic sectional view. The mixer 16 includes a mixing container 20, ports 22 and 24, and a piping system 26. An ozone gas (dotted line) that contains ozone and an HF gas that contains hydrogen fluoride (solid line) are introduced from the ports 22 and 24, respectively, and mixed inside the mixing container 20. The mixed gas flows from the piping system 26 to a nozzle 28 and is jetted in a bell-like form 30 from the nozzle 28. In this process, the cone 14 can prevent unnecessary diffusion of the mixed gas. The silicon wafer is rotated at a predetermined speed by a disk driving device to be described later, and the swinging arm 18 is moved in a windshield wiper-like manner by a nozzle driving device.

As the silicon wafer 12 is rotated and the nozzle 28 is swung, the mixed gas for etching can be supplied over the entire surface of the silicon wafer 12. It should be understood from the figure that the surface of the silicon wafer 12 can be monitored by a monitoring device (not shown) such as an ellipsometer since the surface of the silicon wafer 12 is not completely covered by the nozzle 28 or the cone 14. With the ellipsometer, changes of chemical properties, compositions, and the like on the surface of the silicon wafer 12 may be measured during the etching as well as the thickness of the oxide film.

Figure 1C:
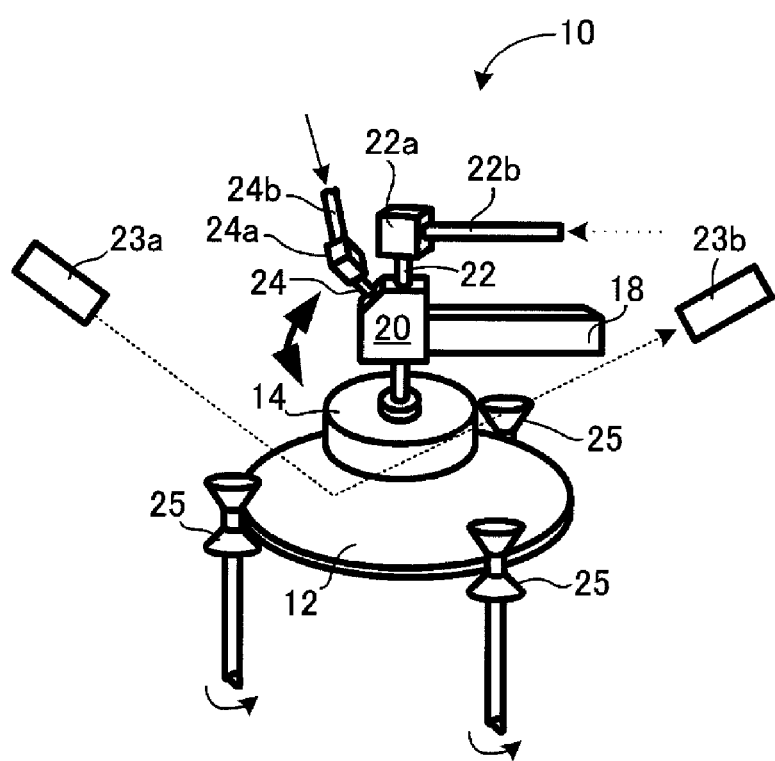
FIG. 1C is a schematic perspective view showing the etching apparatus of FIG. 1A.

FIG. 1C is a schematic perspective view of a typical example of the etching apparatus 10 of FIG. 1A. The mixing container 20 is connected to the swinging arm 18. The port 22 is connected to a flow rate adjuster 22a capable of regulating the flow rate of ozone gas passing through a tube 22b connected to the ozone gas source. The port 24 is also connected to a flow rate adjuster 24a capable of regulating the flow rate of HF gas passing through a tube 24b connected to the HF gas source. The top surface of the silicon wafer 12 is monitored by an elipsometer with a light emitting part 23a and a light receiving part 23b. The broken line indicates a typical light path between the two parts. And the surface can be monitored when the cone 14 is swung away from the light path. The silicon wafer 12 is rotatably supported by rotating supporting members 25 having a bobbin-like shape on the top of the respective vertical rods. In this figure, the apparatus is designed such that only the top surface is subject to the etching process, but the same or similar part arrangement may be made for the bottom surface of the silicon wafer such that the two surfaces may be processed at the same time.

Figure 2A:
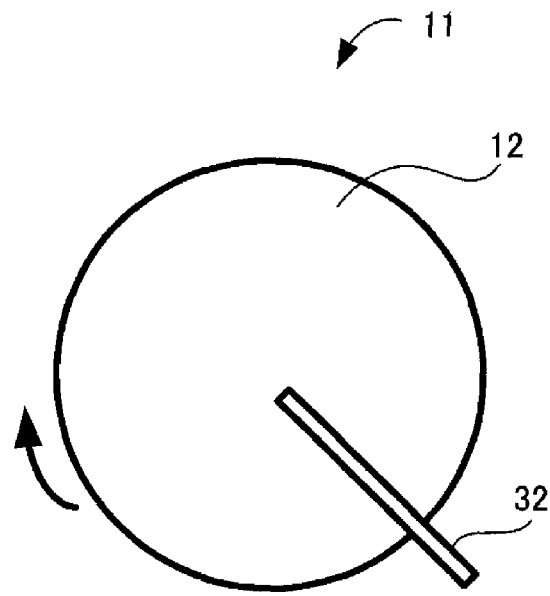
FIG. 2A is a schematic plan view showing a general configuration of an etching apparatus according to another embodiment of the present invention.
Figure 2B:
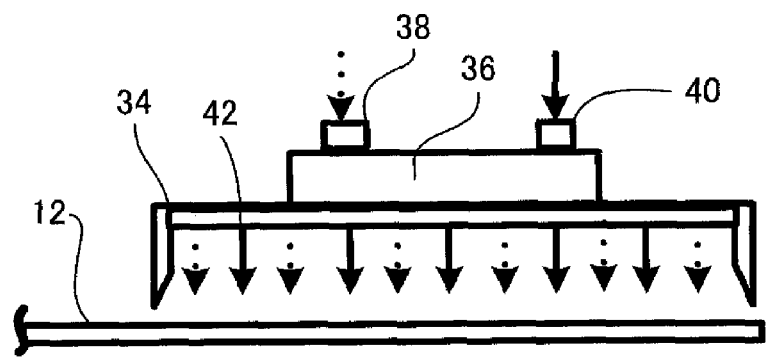
FIG. 2B is a schematic sectional view showing the other etching apparatus of FIG. 2A.

FIG. 2A is a plan view showing a general configuration of an etching apparatus 11 according to another embodiment of the present invention and FIG. 2B is a sectional view showing a general configuration of the etching apparatus 11. A silicon wafer 12 is set in the apparatus 11 rotatably in a clockwise manner as indicated by the arrow and a nozzle 32 is suspended thereabove. A distributor 36 is disposed on an top portion of a main body 34 of the nozzle 32, and the ozone gas (dotted line) that contains ozone and the HF gas that contains hydrogen fluoride (solid line) are introduced from ports 38 and 40, respectively, and mixingly jetted onto the surface of the silicon wafer 12. A plurality of minute pores are opened on a bottom face 42 of the main body 34, and the mixed gas which is mixed in the distributor 36 and may contain unmixed gases is jetted from these pores. As the silicon wafer 12 is rotated, the mixed gas for etching can be supplied over the entire surface of the silicon wafer 12 even though the nozzle 32 is fixed.

Figure 3:
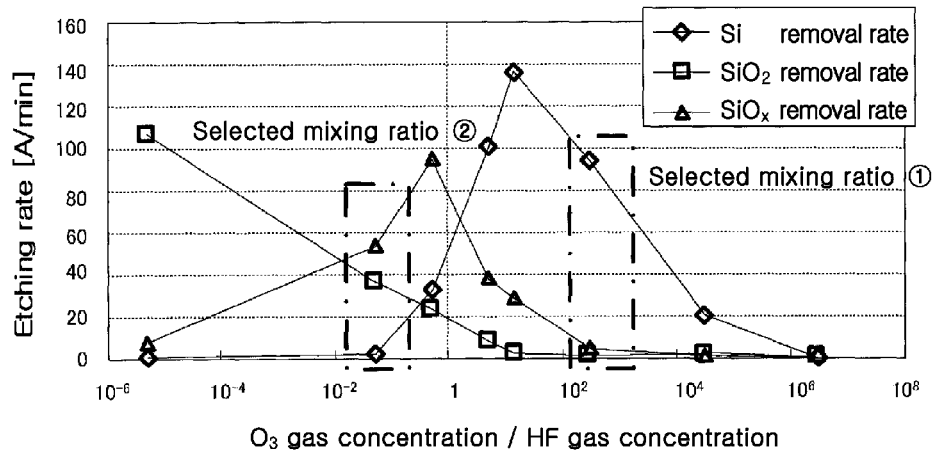
FIG. 3 shows a graph of experimental results of etching the silicon wafer with an etching apparatus according to the embodiment of the present invention.
Figure 4:
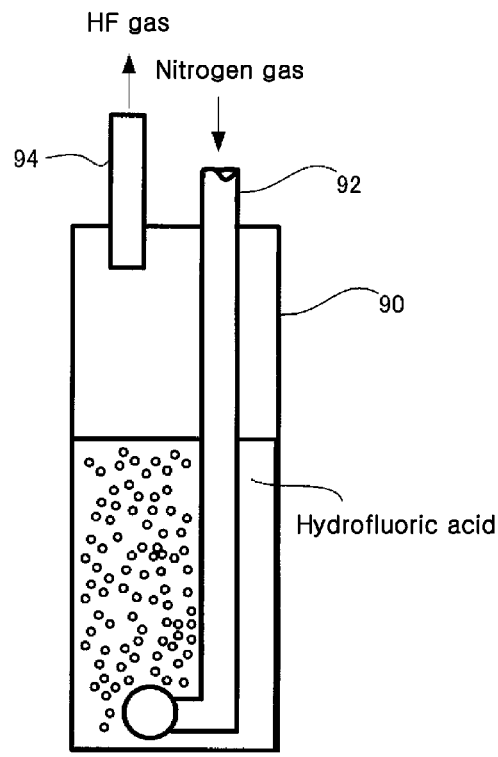
FIG. 4 shows a schematic sectional view of a sample HF gas generator according to the embodiment of the present invention.

FIG. 3 shows a graph of results of an etching experiment of the silicon wafer 12 using the etching apparatus shown in FIG. 1. The vertical axis of the graph indicates the etching rate and the horizontal axis indicates the ratio of the ozone concentration and the hydrogen fluoride concentration. The ozone gas was generated by a commercially available ozone gas generator (generating device), and the HF gas was generated by the device shown in FIG. 4. An aqueous hydrofluoric acid solution of 50% concentration was placed in a practically sealed container 90, nitrogen gas was made to flow at a flow rate of 10 liters/minute from the tube 92, and the HF gas was supplied at a flow rate of 10 liters/minute from the tube 94. The respective gases were regulated in flow rate by flow rate regulating valves (not shown) and supplied at predetermined ratios to the ports 22 and 24, respectively.

The plotting by diamond markers in FIG. 3 indicates silicon removal rates at different respective ratios, the plotting by square markers indicates $SiO_2$ removal rates, and the plotting by triangle markers indicates $SiO_x$ removal rates. The $SiO_2$ removal rate exhibits the maximum value at the lowest ratio, decreases with an increase of the ratio, and then becomes substantially zero at the ratio of approximately 10. Meanwhile, the $SiO_x$ removal rate increases gradually until the ratio becomes 1, exhibits the maximum value at the ratio close to 1, and thereafter decreases and becomes substantially zero when the ratio becomes nearly 100. The silicon removal rate is substantially zero at the ratio of approximately 0.1, then rises steeply, then increases gradually until the ratio becomes close to 10, exhibits a maximum at the ratio close to 10, and thereafter decreases and becomes substantially zero when the ratio reaches nearly 1000000. The etching rate thus differs according to the targeted material, and a suitable mixing ratio can be supplied according to the material.

For example, Si can be etched selectively in the range of selected mixing ratio (1) since the Si removal rate is adequately high while the other rates are substantially zero. While the Si removal rate is nearly zero, the other rates exhibit considerable values (from approximately 30 to 60) such that $SiO_2$ and $SiO_x$ can be etched selectively in the range of selected mixing ratio (2). Put it in another way, it is rather easy to control etching the material as the material is etched slowly in the range of selected mixing ratio where the etching rate of the material is low.

Thus, Si and $SiO_2$ films can be removed while the film thickness is monitored in a dry environment. As mentioned above, the etching apparatus according to the present embodiment blows the mixed gas from the gas mixing nozzle onto the wafer placed on the device having the spinning mechanism. Therefore, the specification of the apparatus is not necessarily limited to a high specification, in which the strength of the piping system, for example, must be at least a predetermined value so as to sustain the pressure since the apparatus is provided with a vacuum chamber and the like.

Figure 5:
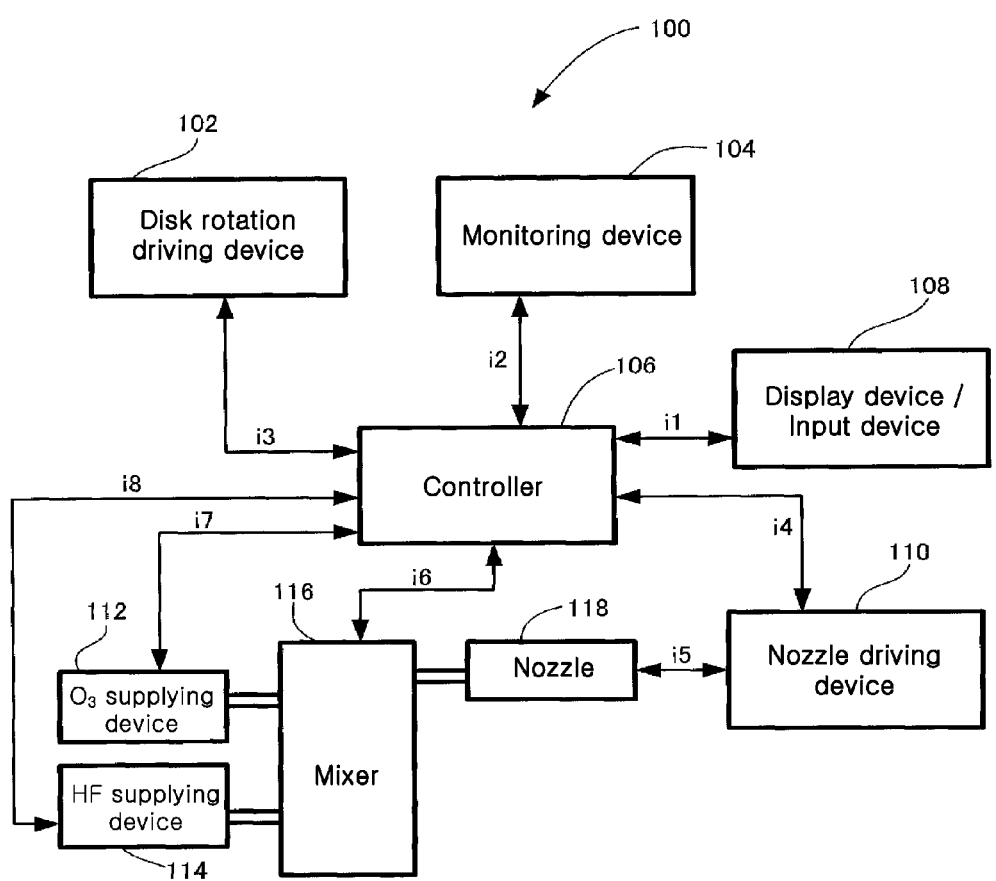
FIG. 5 is a block diagram showing a control system of the etching apparatus according to the embodiment of the present invention.

FIG. 5 is a block diagram of an apparatus for performing the process of the present embodiment. The etching apparatus 100 having a control function comprises: a disk rotation driving device 102 capable of carrying and rotating the silicon wafer 12; a monitoring device 104 capable of optically monitoring the surface of the silicon wafer 12; a display device/input device 108 capable of inputting initial conditions, etc., and displaying the etching conditions; a nozzle driving device 110 capable of driving the nozzle 118, an ozone supplying device 112 capable of supplying the ozone gas and regulating the amount thereof, an HF supplying device 114 capable of supplying the HF gas and regulating the amount thereof, a mixer 116 capable of receiving the gases from the supplying devices and mixing the gases; and a controller 106 capable of interacting with the respective devices by signals i1 to i8 via communication lines that may include wireless means.

Figure 6:
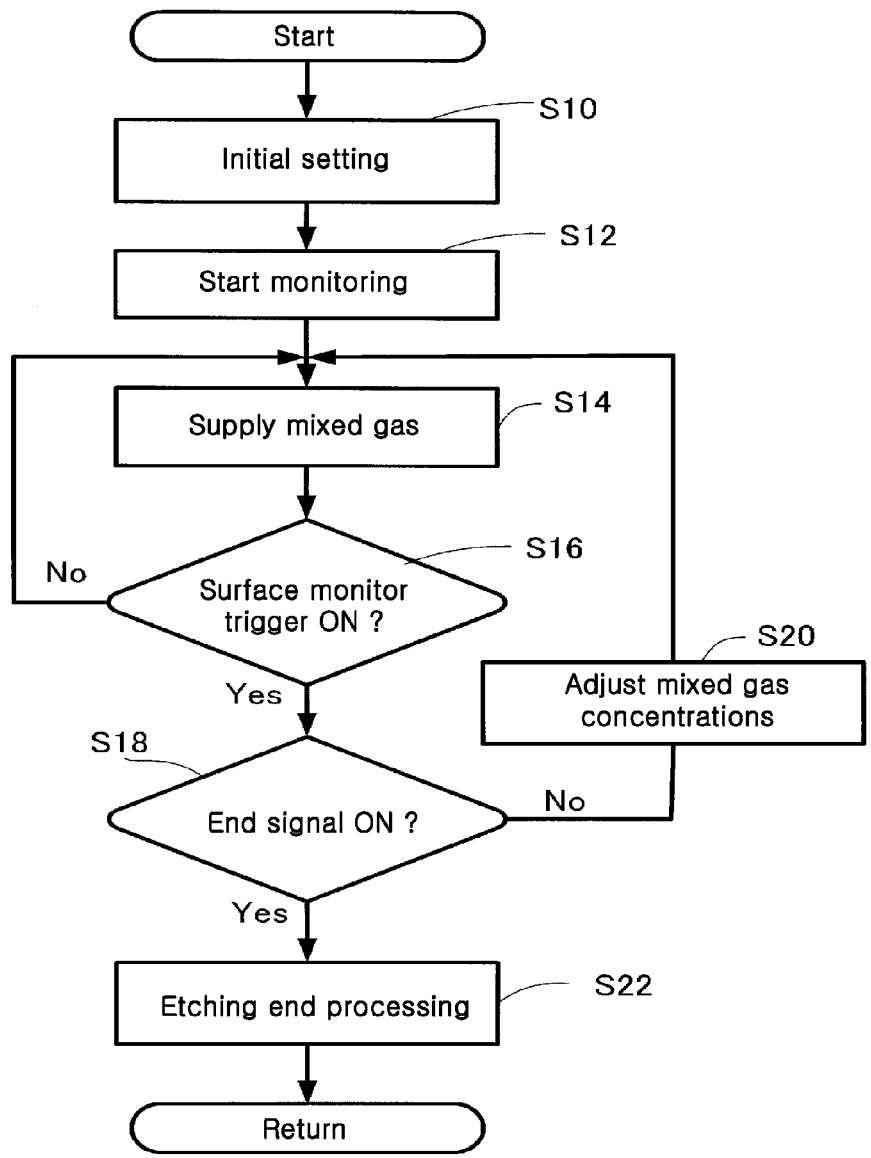
FIG. 6 shows a flowchart of an etching method according to an embodiment of the present invention.

FIG. 6 shows a flowchart of the etching process as an example in the case of utilizing the apparatus as shown in FIG. 5. First, a silicon wafer is set and various initial setting conditions are input (S10). A monitoring step of monitoring the film thickness, etc., of the surface of the silicon wafer by an ellipsometer etc., is then started (S12). A mixed gas for etching is then supplied at a predetermined ratio and etching is started (S14). By monitoring the surface, it is detected whether or not a predetermined trigger event (for example, an etching rate abnormality, completion of etching to a predetermined amount, variation of surface materials, etc.) has occurred (S16). While the gas mixture supplying step (S14) is continued unless the trigger event occurs (S16, No), it is determined whether or not the trigger event indicates the end of etching (S18) once the trigger event occurs (S16, Yes). If the trigger event indicates the end of etching (S18, Yes), a subsequent etching ending step (S22) is entered and the etching process is terminated. If the trigger event does not indicate the end of etching (S18, No), the concentrations of the respective components in the mixed gas are adjusted again (S20) and then the readjusted mixed gas is continuously supplied. Thus, a feedback control may be conducted during the etching such that it is possible to control the film thickness precisely.

Figure 7:
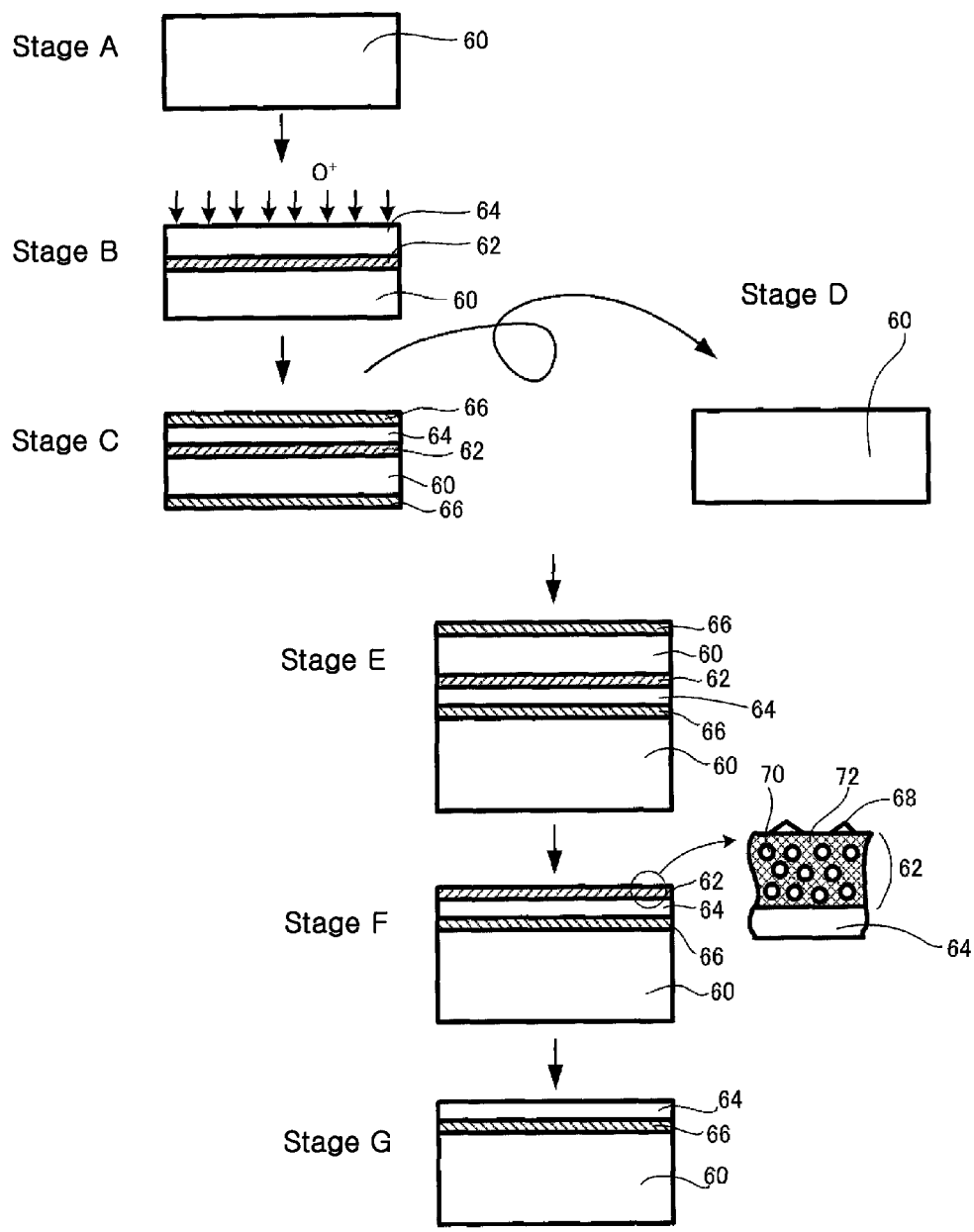
FIG. 7 is a diagram illustrating a manufacturing method of an SOI wafer according to an embodiment of the present invention.

FIG. 7 illustrates an application of the present invention to the manufacture of an SOI wafer. First, two silicon wafers 60 are prepared (Stages A and D), and oxygen is ion-implanted (Stage B) in one of the wafers 60 to form a BOX layer 62 below a top layer 64. The wafer is then thermally oxidized under predetermined conditions to form oxide films 66 on both upper and lower surfaces (FIG. 7C). This wafer is then flipped over and adhered to the other unprocessed wafer 60. An adhesion process is performed to prepare an adhered wafer (Stage E), and the oxide film 66 and the bulk silicon are removed by polishing or the like (Stage F). In this process, an enlarged view of the section near the top surface illustrates that remaining silicon 68 which has not been removed by polishing is present partially on the surface of the oxide film (also referred to as a BOX layer or a buried oxide film) 62, and $SiO_2$ 70 and $SiO_x$ 72 are present in a mixed manner in the BOX layer 62. A favorable SOI layer is formed by removing the BOX layer 62 by the etching method or the etching apparatus according to the present invention (Stage G).

On the other hand, in the conventional method of bonding, the above-described oxide film (BOX layer) 62 may not be present. In this case, an $SiO_2$ film, which is likewise called a BOX layer 66, is disposed below the Si of the wafer, and the Si is etched to form an SOI layer (silicon-on-insulator layer) to a thin film. In this process, the film thickness can be monitored using a reflection type of optical sensor that uses infrared ray or the like. An etching process to a predetermined film thickness can be performed by feedback of the film thickness. Although in the method of manufacturing the SOI wafer described above, the Si on the SIMOX (Separation by IMplanted OXygen) side is removed by polishing to further perform etching, there are Si residues 68 that are embedded in rough surface formed by the polishing. It is possible to remove just the Si residues 68 by etching the wafer, for example, in the range of the selected mixing ratio (1) as shown in FIG. 3. Also, in many cases, the implanted layer is not a perfectly stoichiometric $SiO_2$ film, but it is an $SiO_x$ film. Although it is necessary to etch this film, it would rather not etch the Si that is the SOI layer. Processing without etching the SOI layer is made possible by performing the etching process at the selected mixing ratio (2).

Here, when the concentration of the $O_3$ gas is set to zero in etching just the $SiO_2$, the Si or $SiO_x$ are hardly removed. Thus, it is possible to conduct the etching in a variety of manner by selecting the mixing ratio and monitoring the film thickness and such etching may apply to a wide range of application area. The present invention is not only applied to the etching of SOI wafers, but also to the etching of other wafers so that the etching of Si, $SiO_2$, $SiO_x$, etc. on the wafers can be made based on the present invention as the film thickness is monitored.

For example, a marker (for example, an oxide layer), which has properties to be optically monitored with ease, may be buried in the silicon wafer and the etching process can be terminated at the point when this marker is detected.

As aforementioned, the present invention may provide following.

A method of etching a semiconductor wafer is provided. The method comprises a jetting step of jetting a mixed gas including hydrogen fluoride and ozone onto a surface of a semiconductor wafer; a monitoring step of monitoring the surface of the semiconductor wafer (for example, a thickness of a layer to be etched); an analyzing step of analyzing the surface of the semiconductor wafer; and an adjusting step of adjusting either or both of the hydrogen fluoride concentration and the ozone concentration in the mixed gas based on a result of the analyzing step. Thus, a flow rate of the hydrogen fluoride gas and/or a flow rate of the ozone gas is regulated so as to adjust the respective concentrations.

The method as described above may be characterized in that the surface of the semiconductor wafer is monitored at least optically in the monitoring step.

Here, monitoring of the surface of the semiconductor wafer may include detecting and analyzing a property of the surface in a contacting or non-contacting manner. Non-contact detection is particularly preferable. The detected property may refer to a physical state and/or a chemical state, and examples of the physical state may include shape information such as roughness, waviness, and undulation of the surface, thickness of the surface layer, etc. By way of example, the thickness of the layer (or film) to be etched may be monitored. The optical monitoring may refer to detection using infrared ray, visible light, ultraviolet ray, X-ray, or other light (or radiation). Such light (or radiation) may include ambient light (for example, environmental light) as well as energy radiated from a specific light source or other means, and may include light emitted as a result of interaction with the surface to be monitored. For example, the film thickness may be monitored by an ellipsometer, an optical interference method, an X-ray fluorescence phase method, etc. More specifically, the thickness of the surface layer to be etched may be monitored by the ellipsometer, this thickness may be measured as needed or with predetermined time intervals, and the chronological variation of the thickness may be detected as a rate of film thickness decrease (or, in some cases, film thickness increase). Since the film thickness after a predetermined time can be calculated based on a rate of decreasing film thickness obtained in this manner, the adjustment of either or both of the hydrogen fluoride concentration and the ozone concentration can be started in order to etch the surface of the wafer to achieve a predetermined film thickness of the top layer (or film) even before completion of the etching process. The concentration adjustment of the mixed gas can be performed appropriately in accordance with materials appearing on the surface. In the case where a plurality of types of materials appear on the surface, a specific material can be etched selectively by adjusting the mixing ratio of the mixed gas.

The method as aforerecited may be characterized in that the semiconductor wafer has an etching marker inside. Here, the etching marker may be any maker that can be detected in the monitoring step. Even though having not been detected, the etching maker may get detected during the progress of etching, and then the etching may be terminated or interrupted, or an etching condition may be changed based on the detection result.

For example, an oxide film, nitride film, dissimilar metal, foreign matter, or impurity, etc., may be selected as the etching marker depending on the sensitivity of the monitoring device. The etching can thus be terminated when the oxide or the like is detected. Therefore, the etching can be rather performed without excess or insufficiency if compared to the case of performing the etching for a predetermined etching time having determined even before the actual etching based on an estimated etching rate. Also, when the oxide or the like is detected, the etching condition can be adjusted to be optimal with respect to the detected substance.

The method as aforerecited may be characterized in that the hydrogen fluoride concentration is increased to increase a removal rate of an oxide on the surface of the semiconductor wafer. Here, the following reactions are considered to be involved in the mechanism of silicon etching.

[Formula 1]

$$Si + \frac{2}{3}O_3 \rightarrow SiO_2 \quad \text{(Equation 1)}$$

[Formula 2]

$$SiO_2 + 4HF \rightarrow SiF_4 + 2H_2O \quad \text{(Equation 2)}$$

By comparison, it is considered that the following reaction is involved in the case of an aqueous system.

[Formula 3]

$$SiO_2 + 6HF \rightarrow H_2SiF_6 + 2H_2O \quad \text{(Equation 3)}$$

As mentioned above, the etching mechanism is considered to progress on the basis of the two reactions of Formulae (1) and (2). That is, the etching progresses by formation of silicon oxide by oxidization of the silicon surface and formation of silicon tetrafluoride (gas) by reaction of the silicon oxide and the hydrogen fluoride. In the case where the silicon oxide exists on the surface at the beginning, it is preferable to increase the hydrogen fluoride concentration relatively because the hydrogen fluoride is more important than the ozone at this time. The hydrogen fluoride concentration (partial pressure) in the mixed gas for etching may be made higher than that in the mixed gas in the case where no oxide or not much oxide exists on the wafer surface. For example, the hydrogen fluoride concentration (partial pressure) may be made high relatively if the total pressure does not change. More specifically, the hydrogen fluoride concentration (partial pressure) may be increased by decreasing the carrier gas (for example, nitrogen). The hydrogen fluoride concentration (partial pressure) may also be increased while increasing the overall pressure. This is because the reaction rate of a solid and a gas is usually considered to increase according to an increase of the partial pressure of the reactive component in the gas.

A manufacturing method of an SOI wafer may be provided wherein the method of etching as aforerecited is utilized to etch either or both of a silicon layer and an oxide film layer. The method of manufacturing an SOI wafer from a silicon wafer comprises the steps of: jetting a mixed gas including hydrogen fluoride and ozone onto a surface of a silicon wafer; monitoring the surface of the silicon wafer; analyzing the surface of the silicon wafer; and adjusting at least one of the hydrogen fluoride concentration and the ozone concentration in the mixed gas based on a result of the analysis.

An etching apparatus of a semiconductor wafer is provided. The etching apparatus comprises: a monitoring device capable of monitoring a surface of the semiconductor wafer; a nozzle capable of jetting the mixed gas that contains hydrogen fluoride and ozone onto the surface of the semiconductor wafer; and a regulator capable of adjusting at least one of hydrogen fluoride concentration and ozone concentration in the mixed gas.

The etching apparatus as aforerecited may be characterized in that the monitoring device monitors at least optically the surface of the semiconductor wafer.

The etching apparatus as aforerecited may comprise an analyzing device capable of calculating either or both of an optimal hydrogen fluoride concentration and an optimal ozone concentration based on the monitoring result obtained from the monitoring device.

Thus in the present invention, a gas mixture of ozone and hydrogen fluoride can be used as the etching gas, and it is not necessary to make a special condition to generate a plasma or stabilize ions. Processes can be performed under normal temperature and normal pressure, and an etching endpoint can be detected while monitoring the Si film thickness or the $SiO_2$ film thickness. Here, an ozone gas is high in oxidizing ability as an etching agent. An HF vapor is high in the ability to dissolve the $SiO_2$ film. For example, the ozone gas can be generated by the electrical discharge in oxygen gas, and the HF vapor can be obtained by bubbling $N_2$ through an HF solution. The mixed gas for etching thus typically contains HF, water, and nitrogen. Etching can be performed by blowing the mixed gas onto the wafer, and the etching rate in this process can be varied by controlling the ozone concentration, the HF gas concentration, the flow rate, the temperature, etc. Also, the silicon wafer of a predetermined thickness can be obtained by measuring the film thickness by an optical or infrared sensor, etc., and performing endpoint detection while performing the etching process.

Monitoring of the etched surface can thus be performed because the semiconductor wafer can be etched in the gas phase using the mixed gas that contains hydrogen fluoride and ozone as described above. Meanwhile, the etching can be performed more precisely because either or both of the hydrogen fluoride concentration and the ozone concentration, which are factors that influence the etching rate, can be varied based on a result of the monitoring of the etched surface.

What is claimed is:

1. An etching apparatus of a semiconductor wafer having a marker inside comprising:
    a monitoring device configured to monitor a surface of the semiconductor wafer so as to detect the marker;
    a nozzle configured to jet a mixed gas that includes hydrogen fluoride and ozone onto the surface of the semiconductor wafer;
    a regulator configured to adjust at least one of a hydrogen fluoride concentration and an ozone concentration in the mixed gas; and a controller configured to:
  calculate at least one of optimal concentrations of the hydrogen fluoride and the ozone based on a result obtained by the monitoring device so as to etch a specific material selectively;
  control the regulator to adjust at least one of the hydrogen fluoride concentration and the ozone concentration in the mixed as based on a result of the calculation; and
  determine whether the marker is detected by the monitoring device.

2. The etching apparatus according to claim 1, wherein the monitoring device monitors at least optically the surface of the semiconductor wafer.

3. The etching apparatus according to claim 1, wherein the marker comprises a silicon oxide layer buried inside the semiconductor wafer.

4. The etching apparatus according to claim 1, wherein the controller is further configured to control the regulator to terminate supply of the mixed gas.

5. An etching apparatus for manufacturing a silicon-on-insulator wafer, which is prepared from a silicon wafer having an oxide layer inside, the etching apparatus comprising:
  a monitoring device configured to monitor a surface of the silicon wafer so as to detect the oxide layer;
  a nozzle configured to let a mixed gas that includes hydrogen fluoride and ozone onto the surface of the silicon wafer;
  a regulator configured to adjust at least one of a hydrogen fluoride concentration and an ozone concentration in the mixed gas; and
  a controller configured to:
    calculate at least one of optimal concentrations of the hydrogen fluoride and the ozone based on a result obtained by the monitoring device so as to etch silicon (Si) selectively; and
    control the regulator to adjust at least one of the hydrogen fluoride concentration and the ozone concentration in the mixed gas based on a result of the calculation.

6. The etching apparatus according to claim 5, wherein the controller controls the regulator to increase the hydrogen fluoride concentration to increase a removal rate of silicon oxide of the oxide layer when the oxide layer is detected by the monitoring device.

7. An etching apparatus for manufacturing a silicon-on-insulator wafer, which is prepared from a silicon wafer having an oxide layer inside, the etching apparatus comprising:
  a monitoring device configured to monitor a surface of the silicon wafer so as to detect the oxide layer;
  a nozzle configured to jet a mixed gas that includes hydrogen fluoride and ozone onto the surface of the silicon wafer;
  a regulator configured to adjust at least one of a hydrogen fluoride concentration and an ozone concentration in the mixed gas; and
  a controller configured to:
    calculate at least one of optimal concentrations of the hydrogen fluoride and the ozone based on a result obtained by the monitoring device so as to etch silicon dioxide ($SiO_2$) and silicon oxide ($SiO_x$) selectively; and
    control the regulator to adjust at least one of the hydrogen fluoride concentration and the ozone concentration in the mixed gas based on a result of the calculation.

* * * * *

UNITED STATES PATENT AND TRADEMARK OFFICE
CERTIFICATE OF CORRECTION

| | | |
|---|---|---|
| PATENT NO. | : 9,305,850 B2 | |
| APPLICATION NO. | : 13/586721 | |
| DATED | : April 5, 2016 | |
| INVENTOR(S) | : Kozasa et al. | |

It is certified that error appears in the above-identified patent and that said Letters Patent is hereby corrected as shown below:

Claims

<u>Column 9</u>

Line 9, claim 1, "as" should read --gas--

Line 29, claim 5, "let" should read --jet--

Signed and Sealed this
Seventh Day of June, 2016

Michelle K. Lee
*Director of the United States Patent and Trademark Office*